(12) United States Patent
Knaipp

(10) Patent No.: US 9,076,676 B2
(45) Date of Patent: Jul. 7, 2015

(54) HIGH-VOLTAGE TRANSISTOR DEVICE AND PRODUCTION METHOD

(71) Applicant: ams AG, Unterpremstätten (AT)

(72) Inventor: Martin Knaipp, Unterpremstätten (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 14/365,080

(22) PCT Filed: Nov. 21, 2012

(86) PCT No.: PCT/EP2012/073280
§ 371 (c)(1),
(2) Date: Jun. 12, 2014

(87) PCT Pub. No.: WO2013/087386
PCT Pub. Date: Jun. 20, 2013

(65) Prior Publication Data
US 2014/0332906 A1  Nov. 13, 2014

(30) Foreign Application Priority Data
Dec. 14, 2011  (DE) .......................... 10 2011 056 412

(51) Int. Cl.
*H01L 29/10* (2006.01)
*H01L 21/266* (2006.01)
*H01L 29/78* (2006.01)
*H01L 29/06* (2006.01)
*H01L 29/66* (2006.01)

(52) U.S. Cl.
CPC .......... *H01L 29/1033* (2013.01); *H01L 21/266* (2013.01); *H01L 29/7816* (2013.01);
(Continued)

(58) Field of Classification Search
USPC ......................................................... 257/409
See application file for complete search history.

(56) References Cited

U.S. PATENT DOCUMENTS 5,583,365 A * 12/1996 Villa et al. .................... 257/409
5,907,173 A *  5/1999 Kwon et al. .................. 257/336
(Continued)

FOREIGN PATENT DOCUMENTS

DE    102005054672 A1   5/2007
EP       1085574 A2      3/2001
(Continued)

OTHER PUBLICATIONS

Terashima, Tomohide et al., "A New Level-shifting Technique by divided RESURF Structure", Power Semiconductor Devices and ICS, 1997. ISPSD 97, 1997 IEEE International Symposium on Weimar, Germany, May 26-29, 1997, pp. 57-60.

*Primary Examiner* — Thao P Le
(74) *Attorney, Agent, or Firm* — McDermott Will & Emery LLP

(57) ABSTRACT

A body region (3) with a first type of electric conductivity is arranged at the upper surface (10) of a substrate (1) in a well (2), wherein a portion of the well that is not occupied by the body region has a second type of conductivity opposite the first type of conductivity. At the upper surface, a source region is arranged in the body region and a drain region is arranged in the well at a distance from the body region; the source region and the drain region both have the second type of conductivity. The body region is arranged underneath a surface area of the upper surface that has a border (7) with opposing first border sides (8). The well has a varying depth in the substrate. The depth of the well is smaller underneath the first border sides of the body region than in a portion of the body region that is spaced apart from the first border sides.

10 Claims, 2 Drawing Sheets

(52) U.S. Cl.
CPC ........ *H01L29/0692* (2013.01); *H01L 29/0684* (2013.01); *H01L 29/66477* (2013.01); *H01L 29/78* (2013.01)

(56) References Cited

U.S. PATENT DOCUMENTS

| | | | |
|---|---|---|---|
| 6,448,625 B1 * | 9/2002 | Hossain et al. | 257/493 |
| 7,592,661 B1 * | 9/2009 | Lee et al. | 257/311 |
| 7,663,203 B2 | 2/2010 | Knaipp | |
| 2012/0187458 A1 * | 7/2012 | Knaipp et al. | 257/256 |
| 2013/0032895 A1 * | 2/2013 | Disney et al. | 257/409 |

FOREIGN PATENT DOCUMENTS

| | | |
|---|---|---|
| EP | 1852916 A1 | 11/2007 |
| JP | 2003-152095 A | 5/2003 |

\* cited by examiner

HIGH-VOLTAGE TRANSISTOR DEVICE AND PRODUCTION METHOD

The present invention pertains to a transistor device for high-voltage applications that is improved with respect to the punch-through voltage and the source-drain blocking voltage.

A high-voltage NMOS transistor that is isolated from the substrate features a deep n-type well in a p-type substrate. The body region is embedded in the n-type well that is connected to the drain. The maximum potential VDD may be applied to the body during regular operation. A sufficiently high n-type doping is introduced between the substrate and the body in order to prevent a substrate body punch-through from occurring. The pn-junction between the body and the well is preferably optimized with respect to the electrical properties. If the body has the substrate potential and VDD is applied to the drain (blocking instance), a voltage in the blocking direction occurs at the pn-junction between the body and the well and the relatively steep pn-junction may cause a premature breakdown. Investigations have shown that breakdowns predominantly occur on well corners and, in particular, on the transistor head. The term transistor head (transistor fingertip) refers to the edge region of the transistor that lies laterally of the longitudinal direction of the current flow through the channel.

U.S. Pat. No. 7,663,203 and DE 10 2005 054 672 A1 describe symmetric structures of high-voltage transistors that elucidate the position of the transistor head in relation to the source, the drain and the channel.

It is the objective of the present invention to disclose a high-voltage transistor device with advantageous operating characteristics, in particular, with respect to the punch-through voltage and the source-drain blocking voltage. The invention also aims to disclose a production method for this device.

These objectives are respectively attained by means of the high-voltage transistor device according to claim 1 and by means of the production method according to claim 6. Embodiments derive from the dependent claims.

The high-voltage transistor device comprises a semiconductor substrate with a doped well, which has a lower boundary in the substrate. The distances of the lower boundary from the upper surface of the substrate vary such that the well has a varying depth in the substrate. In this context, the term depth of the well respectively refers to the dimension of the well that is measured into the semiconductor substrate in the direction perpendicular to its upper surface and extends from the upper surface to the lower boundary of the well.

A body region with a first electrical mode of conductivity is arranged on the upper surface of the substrate in the doped well, wherein a portion of the doped well that is not occupied by the body region has a second mode of conductivity that is opposed to the first mode of conductivity. On the upper surface of the substrate, the body region features a border with opposing first border sides and opposing second border sides. A source region with the second mode of conductivity is arranged on at least one of the second border sides in the body region. A drain region with the second mode of conductivity is arranged opposite the source region on the upper surface in the well at a certain distance from the body region.

The distances between the upper surface of the substrate and the lower boundary of the well are smaller on the first border sides of the body region than on the second border sides. The depth of the well therefore is smaller underneath the first border sides of the body region than in a portion of the body region that is spaced apart from the first border sides and comprises the channel region.

The first border sides of the body region lie on the transistor head (transistor fingertip), i.e., in the lateral edge regions of the transistor referring to the channel region which lie outside the current flow between the source and the drain during the operation of the transistor.

In an embodiment of the high-voltage transistor device, a portion of the body region that lies between the source region and the drain region and is spaced apart from the first border sides of the body region is provided as a channel region.

In a further embodiment, the well has a reduced dopant concentration between the source region and the drain region. In a further embodiment, the first border sides are shorter than the second border sides.

In a further embodiment, the semiconductor substrate has the first mode of conductivity adjacent to the well, namely on the far side of the lower boundary referring to the body region. This is the case, in particular, if the semiconductor substrate is provided with a basic doping for the first mode of conductivity. The doped well may be realized, in particular, in the form of a deep well for isolating the body region from the substrate. In typical embodiments, the first mode of conductivity is p-type conduction and the second mode of conductivity is n-type conduction.

In the production method, a body region with a first mode of conductivity is produced on an upper surface of a semiconductor substrate in a well with an opposite second mode of conductivity by means of dopant implantation such that the well encloses a border of the body region that has opposing first border sides. On the upper surface, a source region with the second mode of conductivity is produced in the body region and a drain region with the second mode of conductivity is produced in the well at a certain distance from the body region. The well is produced in such a way that its depth in the semiconductor substrate in the direction perpendicular to the upper surface is smaller in the region of the first border sides of the body region than in a central portion of the body region that is spaced apart from the first border sides. This is realized by utilizing an implantation mask with a reduced opening in the region of the first border sides.

In an embodiment of the method, the opening in the implantation mask is reduced in the region of the first border sides of the body region in that the opening is divided several times in the region of the first border sides, but continuous outside of this region.

In a further embodiment of the method, the opening is divided into strips that are aligned parallel to the first border sides and transverse to the second border sides in the region of the first border sides of the body region.

In a further embodiment of the method, the opening in the implantation mask is divided into a portion that is arranged above the body region and a separate portion that is arranged above the drain region. In a direction extending parallel to the first border sides of the body region, the portion arranged above the body region has dimensions that are smaller in the region of the first border sides than at a distance from the first border sides.

In a further embodiment of the method, the opening in the implantation mask is likewise divided into a portion that is arranged above the body region and a separate portion that is arranged above the drain region. In a direction extending parallel to the first border sides of the body region, the portion arranged above the drain region has dimensions that are smaller on straight extension of the first border sides than in a region between the straight extensions of the first border sides.

Examples of the high-voltage transistor device and of the production method are described in greater detail below with reference to the attached figures.

Figure 1:
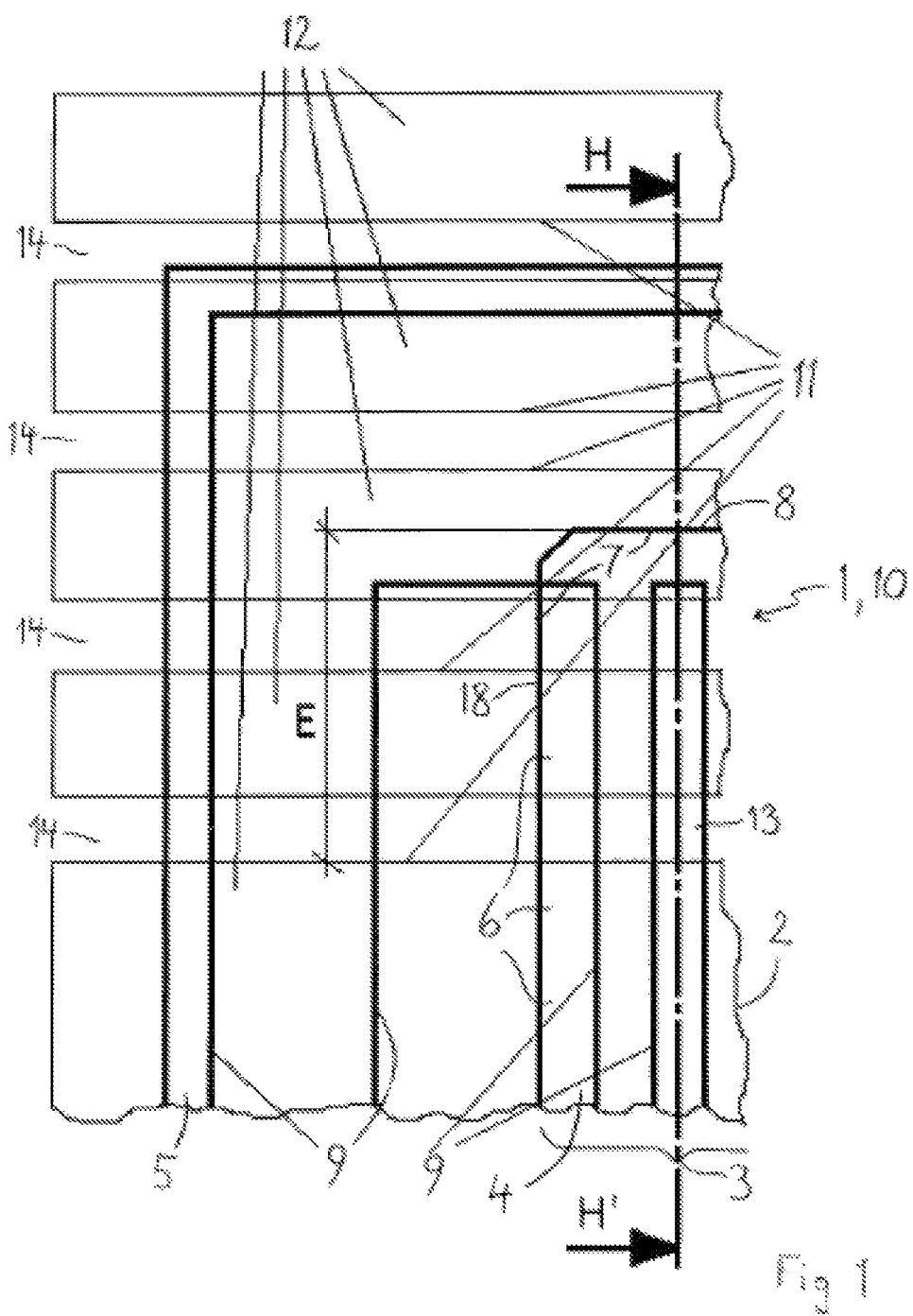
FIG. 1 shows a schematic top view of the positions of the masks and implantation regions for an embodiment of the high-voltage transistor device.

FIG. 1 shows a section of a schematic top view of an embodiment of the high-voltage transistor device. In this embodiment, the arrangement of the transistor components is mirror-symmetric referring to two orthogonal directions. FIG. 1 shows the borders of the regions and masks on an upper surface 10 of a semiconductor substrate 1. A well 2 that is doped for n-type conductivity, for example, is arranged at the upper surface 10 in the semiconductor substrate 1, which, for example, has a basic doping or an intrinsic conductivity for p-type conduction. The modes of conductivity may also be interchanged.

The well 2 is produced by means of an implantation of dopant. The structure of an implantation mask 11 with openings 12 used for this purpose is schematically illustrated in FIG. 1 and described further below. A body region 3 is arranged in the well 2 on the upper surface 10 of the substrate 1 and has a mode of conductivity that is opposite that of the well 2, i.e., p-type conductivity in the described example. The portion of the well 2 that is not occupied by the body region 3 has the mode of conductivity of the well 2, i.e., n-type conductivity in this example. Although the body region 3 with respect to the production technology also represents a doped well, the term well should respectively be interpreted as the doped well 2 in this description and in the claims.

On the upper surface 10, the body region 3 is defined by a border 7 that at least approximately encloses a rectangle and has opposing first border sides 8 and opposing second border sides 18. FIG. 1 shows a device with minimal channel length, in which the first border sides 8 form the narrow sides of the rectangle and the second border sides 18 form the long sides of the rectangle. Alternatively, the first border sides 8 may, regardless of the other characteristics of the embodiments, be exactly as long or longer than the second border sides 18. In order to simplify the description, all embodiments are described with reference to a minimal channel length and the first border sides 8 are respectively referred to as narrow sides 8 and the second border sides 18 are referred to as long sides 18.

A source region 4 with the mode of conductivity of the well 2 is respectively situated on the long sides 18. A drain region 5 with the mode of conductivity of the well 2 is arranged opposite the source region 4 in the well 2 on the upper surface 10 at a certain distance from the body region 3. A channel region 6 that is conventionally controlled by means of a not-shown gate electrode arranged on the upper surface is situated in the body region 3 between the source and the drain. The transistor is realized mirror-symmetric referring to the plane of section H-H' indicated in FIG. 1.

FIG. 1 also shows the borders of the active areas 9. These are the areas of the upper surface 10, in which the semiconductor material of the substrate 1 is not covered with an isolating region. In the respective areas 9, external electric terminals for the source and the drain and a body terminal 13 may be provided, and the gate electrode may be arranged above a gate dielectric.

The implantation mask 11 illustrated in FIG. 1 has an opening 12 that is reduced due to a multiple division in the region around the narrow sides 8 of the body region 3. The division is realized with strips 14 of the implantation mask 11, wherein these strips 14 are aligned parallel to the narrow sides 8 and transverse to the long sides 18 of the body region 3. The implantation is partially shielded by the strips 14 such that less dopant is introduced in the region around the narrow sides 8 and the well 2 is realized shallower at these locations than in the center of the body region 3. With respect to the direction of the current flowing through the channel region 6 between the source and the drain during the operation of the transistor, the narrow sides 8 are situated on the edge of the transistor, namely on the transistor head (transistor fingertip). At these locations, the well 2 therefore is realized shallower than in the region of the current flow through the channel. The dimension E from the narrow side 8 of the body region 3 up to a central region, in which the well 2 essentially reaches its full depth, is defined by the typical diffusion length of the dopant and can be adapted to the respective requirements.

Figure 2:
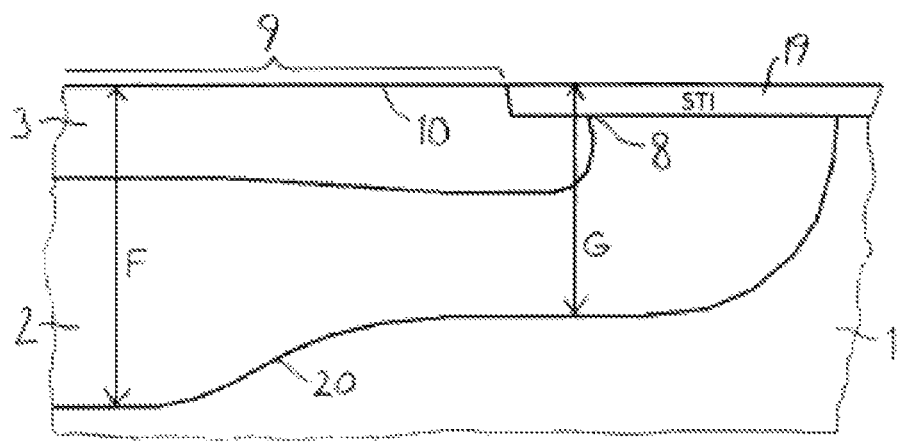
FIG. 2 shows a cross section along the line of section H-H' indicated in FIG. 1.

FIG. 2 shows the cross section in the plane of symmetry H-H' indicated in FIG. 1. The semiconductor substrate 1 contains the doped well 2 and the body region 3 embedded therein on the upper surface 10 of the substrate 1. A body terminal 13 may be provided in the active area 9. The remaining area of the upper surface 10 is covered with isolating regions 19 such as, for example, with a field oxide or preferably with a shallow trench isolation (STI). The distances F, G of the lower boundary 20 of the well 2 from the upper surface 10 measured perpendicular to the upper surface 10 locally vary because the depth of the well 2 varies. In a central area of the body region 3, the well 2 has a depth that is intended for the channel region of the transistor and corresponds to the distance F on the left side in FIG. 2. In a region in the vicinity of the narrow side 8 of the body region 3, the well 2 has a smaller depth that corresponds to the distance G on the right side in FIG. 2. The well 2 with varying depth makes it possible to optimize the region around the lateral edge of the body region 3 in the vicinity of the transistor head with little effort and to realize a high dopant concentration in the well 2 that suffices for a low closing resistance without risking a breakdown on the corners of the body region 3.

Figure 3:
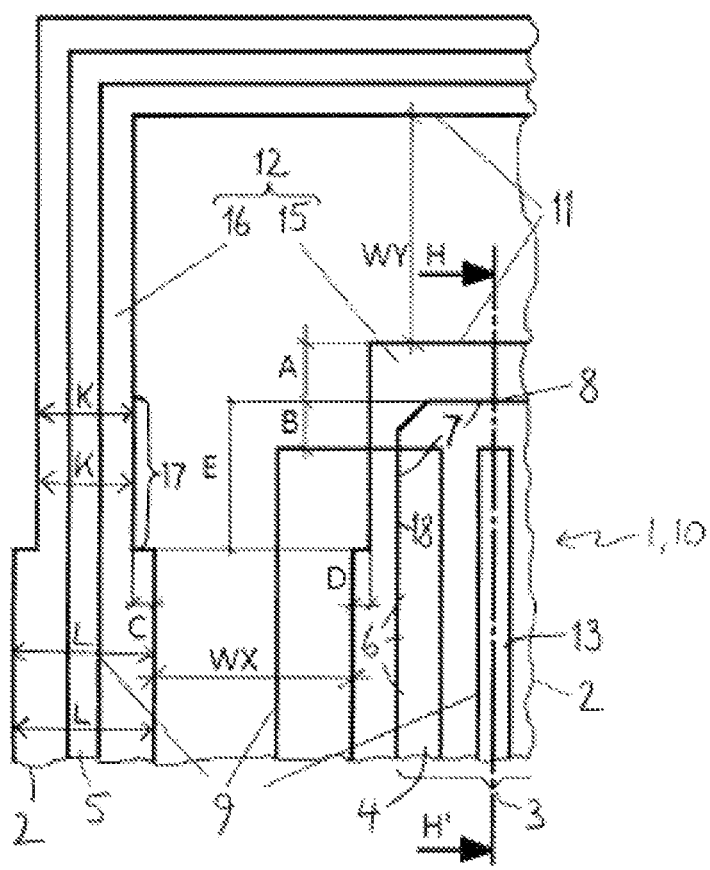
FIG. 3 shows a schematic top view according to FIG. 1 of a further embodiment.

FIG. 3 shows a schematic top view according to FIG. 1 of an embodiment in which the well 2 is produced by means of an implantation that is interrupted between the source and the drain. The embodiment according to FIG. 1 is particularly advantageous for devices that are intended for a typical voltage range of 15 V to 30 V, whereas the embodiment according to FIG. 3 is particularly advantageous for devices that are intended for a typical voltage range of 30 V to 120 V. The implantation mask 11 used for producing the well 2 in the embodiment according to FIG. 3 has an opening 12 with a portion 15 that is arranged above the body region 3 and a separate portion 16 that is arranged above the drain region 5. The other components correspond to the components of the embodiment according to FIG. 1 and are identified by the same reference symbols. The section of the transistor shown is identical to FIG. 1 and therefore allows a direct comparison of the embodiments. According to the dimensions A and B shown, the narrow side 8 of the body region 3 may be respectively spaced apart from the edge of the portion 15 of the opening 12 in the implantation mask 11 (dimension A) and from the edge of the active area 9 (dimension B). The portions 15, 16 of the opening 12 in the implantation mask 11 are spaced apart from one another by the distance WX in the channel region and by the distance WY in the direction extending orthogonal thereto on the transistor head. In preferred embodiments, WY is greater than WX.

The region in which the opening 12 in the implantation mask 11 is reduced begins at a distance from a straight extension of the narrow side 8 of the body region 3, which has the dimension E. In the direction toward the transistor head, the opening 12 is narrower than in the central region starting at the location defined by the dimension E. According to FIG. 3, this may be realized, for example, with a projection in the edge of the opening 12 in the portion 15, in the portion 16 or in both portions 15, 16, for example in steps with the respective dimensions C and D. The portion 16 arranged above the drain region 3 may, in particular, be constricted on both sides in the vicinity of the transistor head as illustrated in FIG. 3. In a direction extending parallel to the narrow sides 8 of the body region 3, the portion 16 therefore has dimensions K, L that are smaller on straight extensions of the narrow sides 8 (dimensions K in regions opposite the corners of the body region 3) than at distances with at least the dimension E from the straight extensions of the narrow sides 8 (dimensions L in the area intended for the current flow between the regions 17). The lateral narrowing or constriction of the opening 12, 15, 16 does not have to be realized in steps, but may alternatively also be realized continuously. A pronounced step in the lower boundary 20 of the well 2 as illustrated in the cross section according to FIG. 2 is preferred for the function of the transistor, so that an abrupt change of the size of the opening 12 in the implantation mask 11 in the vicinity of the transistor head is advantageous.

After the implantation of the dopant intended for the well 2, a continuous well 2 is produced due to the diffusion of the dopant. In the area between the original implantation regions defined by the portions 15, 16 of the opening 12 in the implantation mask 11, the well 2 is produced by means of the diffused dopant only in this embodiment. Between the original implantation regions, the well 2 therefore is less doped and has a smaller depth than in the original implantation regions. This means that the well 2 has a reduced dopant concentration and a reduced depth F between the source region 4 and the drain region 5. This characteristic of the well 2 is advantageous for higher voltages.

The described production method has the advantage that an optimization of the transistor properties can be realized with only the design of the implantation mask used for the production of the doped well. The method therefore allows a significant improvement of the operating characteristics and the reliability of the transistor device despite a low additional production effort.

LIST OF REFERENCE SYMBOLS

1 Semiconductor substrate
2 Well
3 Body region
4 Source region
5 Drain region
6 Channel region
7 Border
8 First border side
9 Active area
10 Upper surface
11 Implantation mask
12 Opening
13 Body terminal
14 Strip
15 Portion of the opening
16 Portion of the opening
17 Region of the opening
18 Second border side
19 Isolating region
20 Lower boundary
A Dimension of a distance to the narrow body side
B Dimension of a distance to the narrow body side
C Dimension of a step in the edge of the mask opening
D Dimension of a step in the edge of the mask opening
E Dimension of a distance to the narrow body side
F Distance, depth of the well
G Distance, depth of the well
K Dimension of the width of the mask opening
L Dimension of the width of the mask opening
WX Dimension of a distance to the well
WY Dimension of a distance to the well

The invention claimed is:

1. A high-voltage transistor device, comprising:
a semiconductor substrate with an upper surface;
a doped well having a lower boundary in the semiconductor substrate, the upper surface and the lower boundary being spaced apart by distances;
a body region being arranged in the well, the body region having a border comprising opposite first border sides at the upper surface and opposite second border sides at the upper surface;
the body region having a first type of electric conductivity;
the body region being adjacent to a portion of the well that has a second type of conductivity opposite the first type of conductivity;
a source region being arranged in the body region at one of the second border sides;
the source region having the second type of conductivity;
a drain region arranged opposite the source region at the upper surface in the well at a distance from the body region;
the drain region having the second type of conductivity;
the distances between the upper surface and the lower boundary of the well being smaller at the first border sides of the body region than at the second border sides.

2. The high-voltage transistor device according to claim 1, wherein a portion of the body region that is located between the source region and the drain region and is spaced apart from the first border sides of the body region is provided as a channel region.

3. The high-voltage transistor device according to claim 1 or 2, wherein the well has a reduced dopant concentration between the source region and the drain region.

4. The high-voltage transistor device according to claim 1 or 2, wherein the first border sides are shorter than the second border sides.

5. The high-voltage transistor device according to claim 1 or 2, wherein the semiconductor substrate has the first type of conductivity adjacent to the well.

6. A production method for a high-voltage transistor device, comprising:
forming a well of a second type of conductivity at an upper surface of a semiconductor substrate by an implantation of a dopant, the well having a depth in the semiconductor substrate perpendicular to the upper surface;
forming a body region of a first type of conductivity, which is opposite the second type of conductivity, in the well by a further implantation of a further dopant, the body region having a border comprising opposite first border sides at the upper surface, such that the well encloses the border of the body region and the body region is adjacent to a portion of the well that has the second type of conductivity;

the well being formed using an implantation mask with an opening that is reduced in an area of the first border sides, so that the depth of the well is smaller in the area of the first border sides than in an area of the body region that is spaced apart from the first border sides;

forming a source region having the second type of conductivity at the upper surface in the body region; and forming a drain region having the second type of conductivity at the upper surface in the well at a distance from the body region.

7. The production method according to claim 6, wherein the opening of the implantation mask is divided several times and thus reduced in the area of the first border sides.

8. The production method according to claim 7, wherein the opening is divided by strips of the implantation mask, which are aligned parallel to the first border sides and transverse to the second border sides.

9. The production method according to claim 6, wherein the opening of the implantation mask is divided into a portion that is arranged above the body region and a separate further portion that is arranged above the drain region, the portion arranged above the body region having dimensions in a direction extending parallel to the first border sides of the body region, the dimensions being smaller in the area of the first border sides than at a distance from the first border sides.

10. The production method according to claim 6 or 9, wherein the opening of the implantation mask is divided into a portion that is arranged above the body region and a separate further portion that is arranged above the drain region, the further portion arranged above the drain region having dimensions in a direction extending parallel to the first border sides of the body region, the dimensions being smaller on straight extensions of the first border sides than in a region between the straight extensions of the first border sides.

* * * * *